United States Patent [19]

Murohara

[11] Patent Number: 5,285,057
[45] Date of Patent: Feb. 8, 1994

[54] IC CARD DEVICE

[75] Inventor: Masaru Murohara, Yokohama, Japan

[73] Assignee: Kabushiki Kaisha Toshiba, Kawasaki, Japan

[21] Appl. No.: 826,137

[22] Filed: Jan. 27, 1992

[30] Foreign Application Priority Data

Mar. 22, 1991 [JP] Japan .................................. 3-58480

[51] Int. Cl.$^5$ ............................................. G06K 19/06
[52] U.S. Cl. ................................... 235/492; 174/250
[58] Field of Search ....................... 257/679; 235/492; 174/250; 361/414

[56] References Cited

U.S. PATENT DOCUMENTS 4,697,073  9/1987  Hara ...................................... 235/487
4,972,580  11/1990  Nakamura ............................ 29/840

FOREIGN PATENT DOCUMENTS 3341115  5/1985  Fed. Rep. of Germany .
3546272  7/1986  Fed. Rep. of Germany .

Primary Examiner—John Shepperd
Attorney, Agent, or Firm—Cushman, Darby & Cushman

[57] ABSTRACT

An IC card has a contact portion which is exposed on one surface of a printed circuit board and has multiple terminals provided to electrically contact an external device. Wirings are arranged on the other surface of the printed circuit board at a position facing the contact portion with the printed circuit board in between, and are printed at least at positions opposite to gaps between the terminals. The arrangement of the wirings thus prevents that portion of the IC card at the gaps from becoming thinner than the other portion of the IC card.

5 Claims, 3 Drawing Sheets

IC CARD DEVICE

BACKGROUND OF THE INVENTION

1. Field of the Invention

The present invention relates to an improvement of an IC card device which prevents its IC chip from breaking.

2. Description of the Related Art

Typical conventional IC cards have an IC and a contact portion integrated into an IC module to provide a unit structure. With the use of such a unit structure, no wirings are laid under the contact portion.

In the case where multiple IC cards and/or parts such as a keyboard and a display need to be arranged, however, it is not possible to integrate all of them into an IC module to provide a unit structure. Therefore, the ICs and the other components are arranged separate from the contact portion as disclosed in, for example, U.S. Pat. No. 4,972,580. This arrangement requires wiring between the ICs and the other components as well as wiring between each IC and the individual contacts. There is not much space left for the wiring due to the mounting space required for the ICs and components. When the ICs and the other components arranged with the contacts in between, the wirings to connect the ICs to the components cannot be laid straight, but should undesirably run around the contacts.

U.S. Pat. No. 4,697,073 teaches contact wirings laid on the top and bottom surfaces of the printed circuit board and connected to multiple segments lying on the topmost surface of the board. The contact wirings are connected to the main chip in a hole. In this case, since contact wiring patterns lie directly below the respect contacts and no contact wiring pattern lies directly below the space between contacts provided side by side on the surface of the board, the former portion of the IC card is made relatively thick while the latter portion of the IC card is made entirely thinner than the other portion. In addition, the printed circuit board on the topmost layer of the IC card has an opening formed in order to expose the contacts from the surface. When external force is applied to the IC card, therefore, stress is likely to concentrate on the thin portion, which may damage the main chip. The conventional IC card having an IC and components arranged separate from the contacts therefore has a problem on the mechanical strength in addition to the aforementioned shortcoming on the laying of the wirings.

SUMMARY OF THE INVENTION

It is therefore an object of the present invention to provide an IC card device designed to prevent that portion of the IC card lying between contacts from becoming thinner than the other portion, thus preventing an IC chip from being broken.

To achieve this object, an IC card device according to the present invention comprises printed circuit substrate for supporting at least one of electric component; contact means attached to one surface of the printed circuit substrate and having multiple terminals provided with gaps therebetween to electrically contact with an external device; and circuit printed on the printed circuit substrate for connecting the contact means and the electric component, and having a portion placed belows at least the gaps between the terminals.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

DETAILED DESCRIPTION OF THE PREFERRED EMBODIMENT

Figure 1:
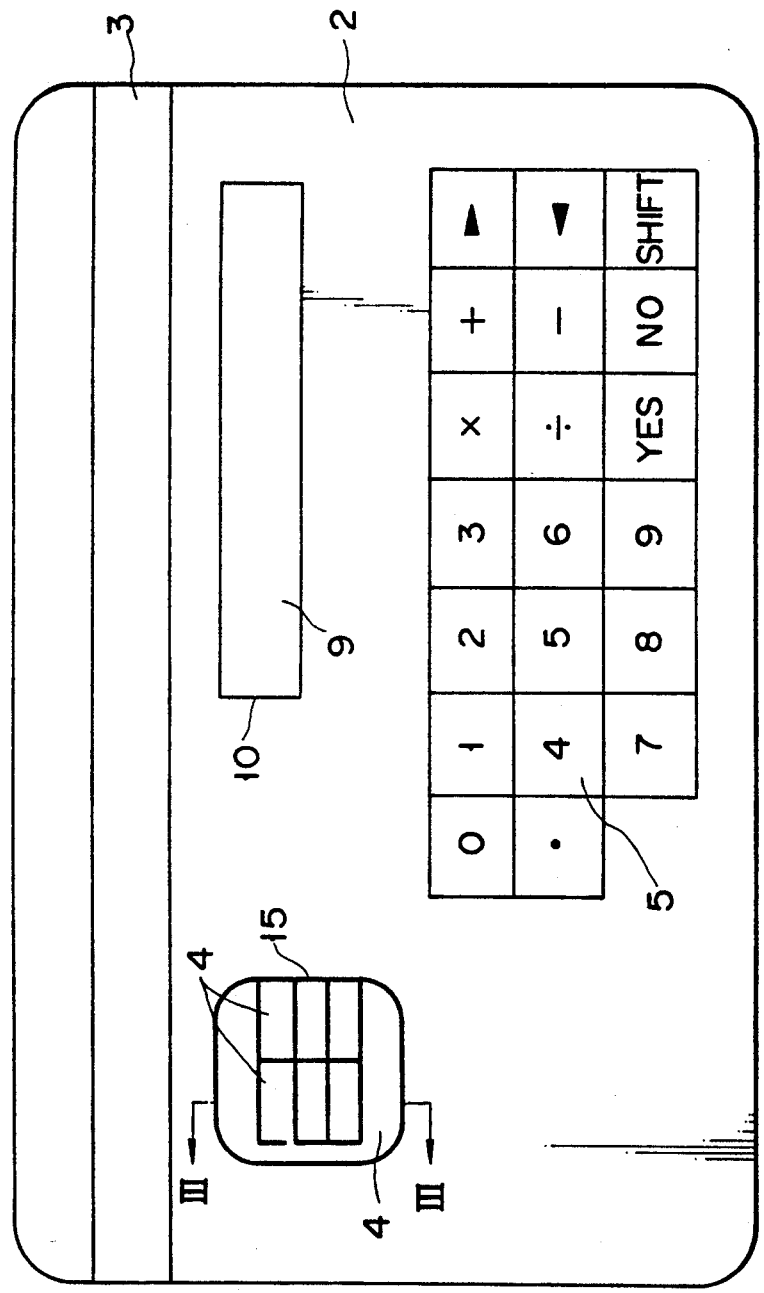
FIG. 1 is a plan view illustrating a multifunction IC card according to one embodiment of the present invention.

An IC card according to a preferred embodiment of the present invention will now be described referring to the accompanying drawings FIG. 1 illustrates the outline of the surface of a multifunction IC card 1 according to the present invention. The multifunction IC card 1 has a resin outer packaging plate 2 adhered on the surface. A magnetic stripe (hereafter referred to as "MS") 3 is provided on the outer packaging plate 2. Magnetic information is written onto or read from the MS 3 by an MS reader/writer (not shown). Various types of keys are printed at a position corresponding to a keyboard module 11 (see FIG. 2) to be described later on the outer packaging plate 2, constituting a keyboard 5. A user can input various data using the keyboard 5. The outer packaging plate 2 further has an opening 15 from where a contact portion 4 to be described in detail is exposed outside. A window 10 is provided on the outer packaging plate 2 in order to make a liquid crystal display (hereafter referred to as "LCD") 9 to be mentioned later visible from the outside.

Figure 2:
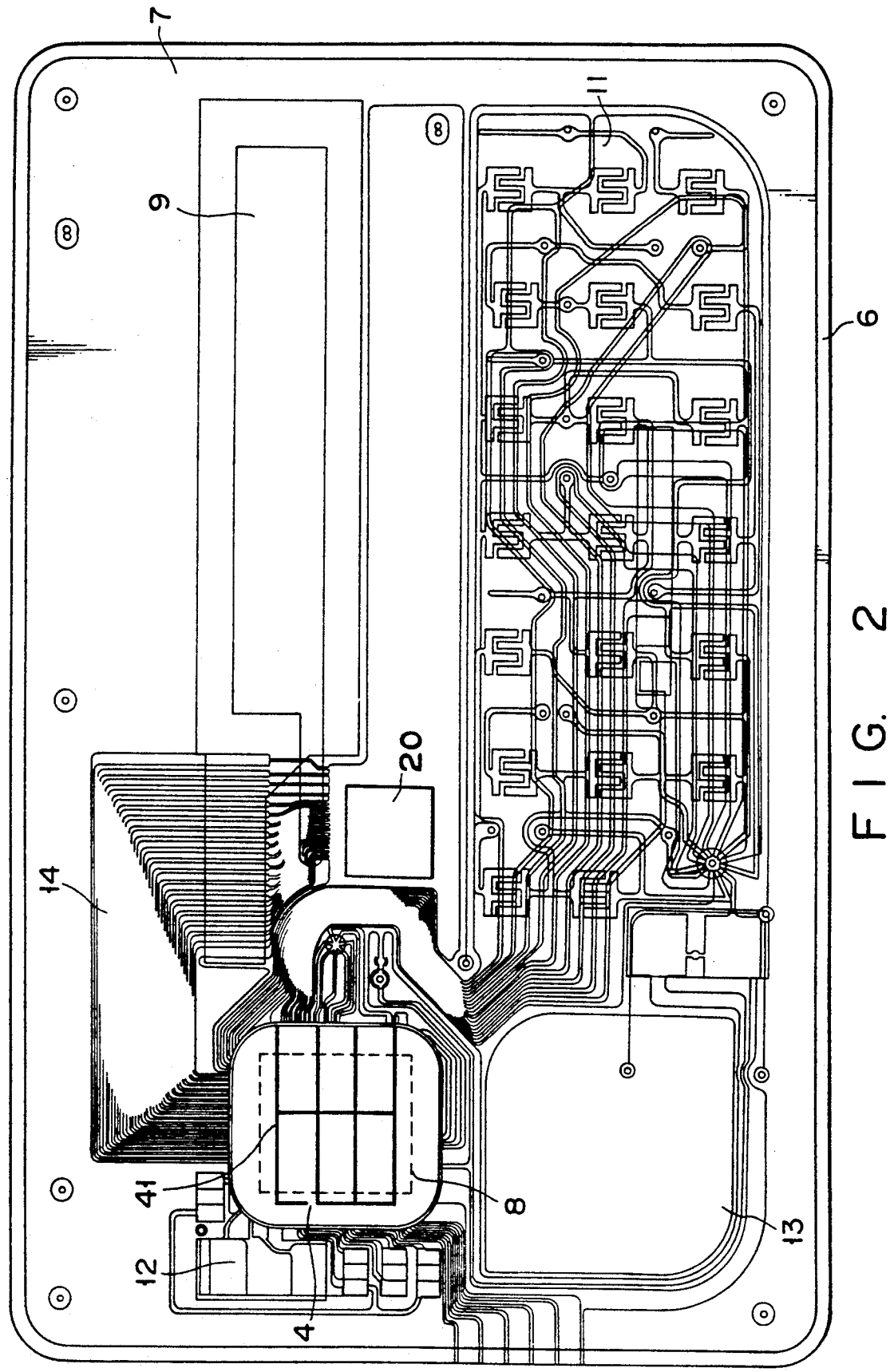
FIG. 2 is a plan view of the IC card in FIG. 1 with its outer packaging removed.

FIG. 2 illustrates the outlook of the IC card 1 with the outer packaging plate 2 removed. The IC card 1 has a frame 6 formed of a hard resin and a printed circuit board 7, which has various electronic components mounted in the space defined by the frame 6. The metal contact portion 4 which electrically contacts to an external device is attached to the printed circuit board 7. The contact portion 4 has, for example, six terminals: an operation voltage supply terminal of a CPU in the card, a reset signal supply terminal of the CPU, an operation clock supply terminal of the CPU, a ground terminal, a data-writing voltage supply terminal and a bidirectional data transfer terminal. A gap 41 is present between the terminals. An IC chip 8 is located at part of the back surface of the contact portion 4 of the printed circuit board 7 (portion indicated by the broken line in FIG. 2). The IC chip 8 has a CPU, which performs the general control of the IC card 1, and a memory, such as an EEPROM which stores various types of information, incorporated. The LCD 9 for displaying the contents of the memory, an LCD driver 20 for driving the LCD 9, the keyboard module 11 which constitutes the keyboard as input means, a crystal oscillator 12 for supplying a clock to the CPU and a battery 13 for supplying a clock to the CPU and a battery 13 for supplying power to the electronic components of the IC card 1 are mounted on the printed circuit board 7. Copper wirings 14 which electrically connect the various electronic components to one another are printed on the printed circuit board 7, for example.

Figure 3:
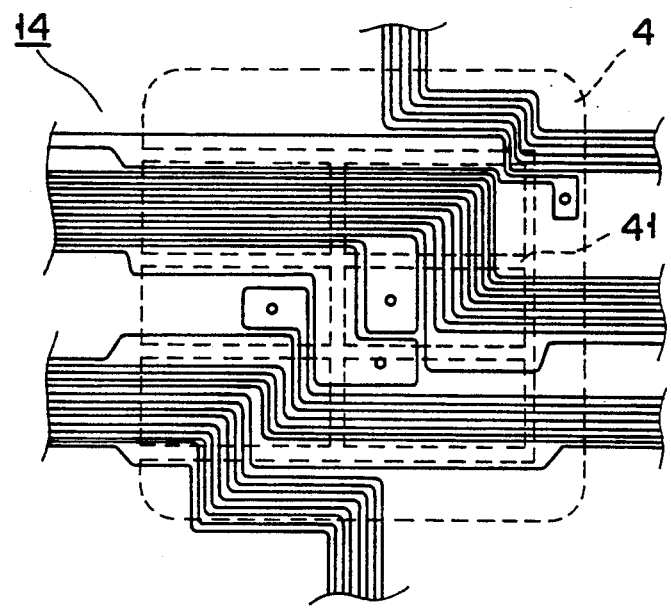
FIG. 3 is a diagram showing the position relationship between a contact portion in FIG. 1 and the printed wirings for that contact portion.
Figure 4:
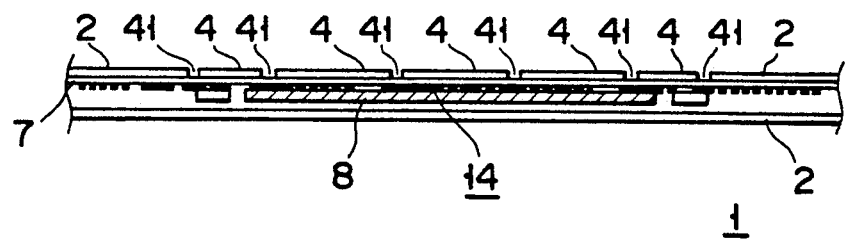
FIG. 4 is a cross-sectional view of the IC card taken along the line III—III in FIG. 1.

FIG. 3 is an enlarged diagram showing where the contact portion 4 is attached to the printed circuit board 7. The position of the contact portion 4 is indicated by the broken line. FIG. 4 shows a cross section of the multification IC card 1 in FIG. 1 taken along the line III—III (cross section of the contact portion 4). As shown in FIGS. 3 and 4, when the contact portion 4 is to be attached to the printed circuit board 7, the wiring 14 on the board 7 is wider at positions where the gaps 41 are located between the respective terminals of the contact portion 4 than where the terminals of the contact portion 4 are located. The wiring 14 can therefore block the gaps 41 if the contact portion 4 is attached to the printed circuit board 7. If the wiring 14 lie across the gaps 41 of the contact portion 4, the wirings 14 are arranged to perpendicularly cross the gaps 41 of the respective terminals of the contact portion 4. In other words, the gaps 41 between the terminals of the contact portion 4 are reinforced from the back by the wirings 14. The multifunction IC card 1 will not become considerably thinner at the gaps 41 of the contact portion 4 than at the other portion of the IC card 1. As a result, even if external force is applied to the contact portion 4, the stress will not concentrate on the gaps 41 between the terminals, thereby preventing the IC chip from being cracked along the gaps 41 of the contact portion 4.

As described above, the multifunction IC card according to this embodiment will not become significantly thinner at the gaps 41 of the contact portion 4 than at other portions of the card. Even with external force applied to the contact portion 4, the stress will not concentrate on the gaps 41, thus preventing a damage on the IC chip which is buried under the contact portion 4. According to this embodiment, the wirings are arranged on that portion of the printed circuit board 7 which corresponds to the gap 41 of the contact portion 4. Instead of arranging the wirings 14, a hard resin may be coated on that portion of the printed circuit board 7 which corresponds to the gaps of the contact portion 4.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An integrated circuit card device comprising:
    a printed circuit substrate for supporting at least one of electronic component;
    contact means disposed on one surface of printed circuit substrate having multiple terminals provided with gaps therebetween for electrically contacting with an external device; and
    a circuit printed on the printed circuit substrate, for connecting the contact means and the electronic component and having at least a portion placed below said gaps, said printed circuit being broader than each of said gaps between said terminals.

2. An IC-card according to claim 1, wherein the conductor tracks which are opposite to the intermediate spaces and which extend parallel thereto are broader in the region of the parallel arrangement than in the region of the non-parallel arrangement.

3. An IC-card according to claim 1, wherein the electronic component is arranged opposite to the contact portion on the other side of the substrate and the conductor tracks lie between the electronic component and the substrate.

4. An IC-card device comprising:
    a substrate having conductor structures as a carrier for at least one electronic component;
    a contact portion which is disposed on a surface of the substrate and which has multiple terminals for electrical connection to an external device and is provided with gap-like intermediate spaces between the terminals; and
    conductor tracks which are disposed on the side of the substrate opposite to the contact portion and which connect the contacts of the contact portion to the electronic component,
    the intermediate spaces being bridged over on the side of the substrate opposite to the contact portion by portions of conductor tracks which are broader than the respective intermediate spaces.

5. An IC-card according to claim 4, wherein portions of conductor tracks perpendicularly cross the intermediate spaces.

* * * * *